United States Patent [19]
Shafer

[11] Patent Number: 5,686,728
[45] Date of Patent: Nov. 11, 1997

[54] PROJECTION LITHOGRAPHY SYSTEM AND METHOD USING ALL-REFLECTIVE OPTICAL ELEMENTS

[76] Inventor: David Ross Shafer, 56 Drake La., Fairfield, Conn. 06438

[21] Appl. No.: 649,957

[22] Filed: May 1, 1996

[51] Int. Cl.$^6$ .................................................. G03F 7/20
[52] U.S. Cl. .................................. 250/492.2; 378/34
[58] Field of Search ................. 250/492, 2; 378/34, 378/85; 359/351, 366, 859, 861; 355/49, 51, 53, 54, 57, 60, 66

[56] References Cited

U.S. PATENT DOCUMENTS

| | | | |
|---|---|---|---|
| 5,222,112 | 6/1993 | Terasawa et al. | 250/492.2 |
| 5,315,629 | 5/1994 | Jewell et al. | 378/34 |
| 5,361,292 | 11/1994 | Sweatt | 378/34 |
| 5,510,230 | 4/1996 | Tennant et al. | 250/492.2 |

*Primary Examiner*—Jack I. Berman

[57] ABSTRACT

A projection lithographic system that operates within the deep ultraviolet to vacuum ultraviolet region of the spectrum and uses an all-reflective optical arrangement to project a reduced image of a lithographic mask onto a semiconductor wafer. The all-reflective optical arrangement includes from six to eight reflective surfaces wherein each of the reflective surfaces is aspheric. The reflective surfaces are disposed along a common optical axis and are arranged not to interfere with the path of light as the light travel from the lithographic mask to the semiconductor wafer.

20 Claims, 2 Drawing Sheets

PROJECTION LITHOGRAPHY SYSTEM AND METHOD USING ALL-REFLECTIVE OPTICAL ELEMENTS

BACKGROUND OF THE INVENTION

1. Field of the Invention

The present invention is a projection lithography system and method for the lithographic patterning of integrated circuits. More particularly, the present invention relates to projection lithography systems and methods that use all-reflective optical arrangements.

2. Description of the Prior Art

In the VLSI industry, the typical projection lithography system used in the production of semiconductor chips uses a reduction camera that projects an image onto a resist coated semiconductor wafer. The projected pattern is transferred onto the semiconductor wafer when the resist is developed. As semiconductor designs evolve, semiconductor manufacturers are faced with the problem of forming ever finer components on larger areas of semiconductor wafer. The formation of finer components on increasingly larger areas of semiconductor wafer represents conflicting manufacturing goals. The formation of increasingly finer components on a semiconductor wafer is typically accomplished by using shorter wavelengths of light during the lithographic patterning. As a result, projection lithography systems now often use blue light, ultraviolet light and deep ultraviolet light in projection cameras having large numerical apertures. However, the use of projection cameras with large numerical apertures makes it difficult to expose a large area of semiconductor wafer. To address this problem, projection cameras have become larger so that the field of exposure for the projection camera is large enough to cover the desired field on the semiconductor wafer. As modern semiconductor applications cause the projection cameras to become increasingly large, the optics contained within the projection cameras become more complex in order to maintain the larger exposure field in sharp focus.

In attempts to achieve higher resolution, semiconductor manufacturers have used 248 nm KrF laser sources and 193 nm ArF laser sources during lithographic patterning. In such a wavelength range, only silica ($SiO_2$) lenses can be used in the projection camera's optics. In lens design, typically lens elements with different indices of refraction are used to reduce various aberrations in the optical system. However, in lithographic patterning applications where only one glass is available, many more lenses must be used in an optical system to accomplish the same degree of aberration correction. In an all-refractive optical system that uses only one glass type, lenses cannot be made to be achromatic. As such, to reduce chromatic aberration, the laser light source is typically narrowed to 0.01 A. Such a laser light source can cause damage to the silica glass elements over time. The damaged lens elements distort the final image of the projection camera, thereby causing flaws in the lithographic patterning being performed with the projection camera.

In an attempt to eliminate the problems associated with the use of glass lenses, lithographic systems have been developed that do not use lenses but rather only use reflective surfaces to create a lithographic pattern. Such a prior art lithographic system is shown in U.S. Pat. No. 5,315,629 to Jewell et al., entitled RINGFIELD LITHOGRAPHY. In the Jewell patent, an soft X-ray source is used to form a lithographic pattern on a semiconductor wafer. The soft X-ray source is focused using a number of reflective surfaces. However, the use of soft X-rays in lithographic patterning creates a number of manufacturing limitations. The use of soft X-rays requires special shielding during manufacturing to prevent exposure to workers. Furthermore, soft X-ray sources having the operational characteristics needed for lithographic patterning are very expensive and are not readily commercially available. In the Jewell patent, the soft X-ray radiation is reflected off four elements prior to the radiation impinging upon the semiconductor substrate. Surfaces capable of accurately reflecting soft X-ray radiation are very inefficient. As such, only a few reflective surfaces can be used in a design before the inherent losses in the design render the design inoperable. Since the number of reflective surfaces that can be used in a soft X-ray system is limited, the design options for that system are also limited.

Another disadvantage of a soft X-ray lithographic projection system is that the reflective surfaces contain complex coatings in order to accurately reflect the soft X-ray radiation. Furthermore, due to the short wavelength of the soft X-ray radiation and the limited number of reflective surfaces allowable for use in the lithographic projection system, the reflective surfaces must be fabricated to tolerances not typically achievable using conventional manufacturing techniques and equipment. As a result, the creation of the reflective surfaces in a soft X-ray lithographic projection system is highly expensive, labor intensive and time consuming.

A need therefore exists in the art for a lithographic projection system that uses an all reflective optical design yet operates at wavelengths much longer than those of soft X-rays, wherein there are not severe limitations on the number of reflectors capable of being used and both a commercially available laser light source and non-exotic reflectors can be used.

SUMMARY OF THE INVENTION

The present invention is a projection lithographic system that operates within the vacuum ultraviolet to the deep ultraviolet regions of the spectrum and uses an all-reflective optical arrangement to project a reduced image of a lithographic mask onto a semiconductor wafer. The all-reflective optical arrangement includes from six to eight reflective surfaces wherein each of the reflective surfaces is aspheric. The reflective surfaces are disposed along a common optical axis and are arranged so as not to interfere with the path of light as the light travels from the lithographic mask to the semiconductor wafer.

The last two reflective surfaces in the optical arrangement form an off-axis Cassegrain relay that creates an intermediate image that is conjugate to the final image on the semiconductor wafer. The presence of the off-axis Cassegrain relay enables the remainder of the system to operate with slower speed ray fans, thereby reducing aberrations. Furthermore, by placing a field stop at the conjugate of the intermediate image, stray light is baffled and system performance is improved.

BRIEF DESCRIPTION OF THE DRAWINGS

For a better understanding of the present invention, reference is made to the following description of two exemplary embodiments thereof, considered in conjunction with the accompanying drawings, in which.

DETAILED DESCRIPTION OF THE DRAWINGS

In a projection lithographic system, the resolution of the optical arrangement within the system can be expressed by the relation:

$$W = K \lambda / NA \quad \text{[Equation 1]}$$

where W is the minimum feature size being created, K is an empirically determined constant that depends upon photoresist parameters, $\lambda$ is the exposure wavelength and NA is the numerical aperture. The numerical aperture (NA) is a quantitative measure of the image acceptance angle for the projection lithographic system. The numerical aperture (NA) is expressed by the relation:

$$NA = N \sin(\theta) \quad \text{[Equation 2]}$$

where N is the refractive index in image space and $\theta$ is the maximum cone angle of light rays accepted by the projection lithographic system.

The present invention projection lithographic system is designed to optimally operate at an exposure wavelength contained between the deep ultraviolet and vacuum ultraviolet regions of the spectrum, i.e between approximately 100 nm and 300 nm. Laser sources that emit light within this frequency range are readily commercially available. The projection lithographic system contains from six to eight reflective surfaces that use the exposure wavelength to reimage a lithographic mask upon a semiconductor wafer. Each of the reflective surfaces contained within the projection lithographic system reflects the exposure wavelength with an efficiency near 90% and possibly as high as 98%, depending upon the exposure wavelength used.

Figure 1:
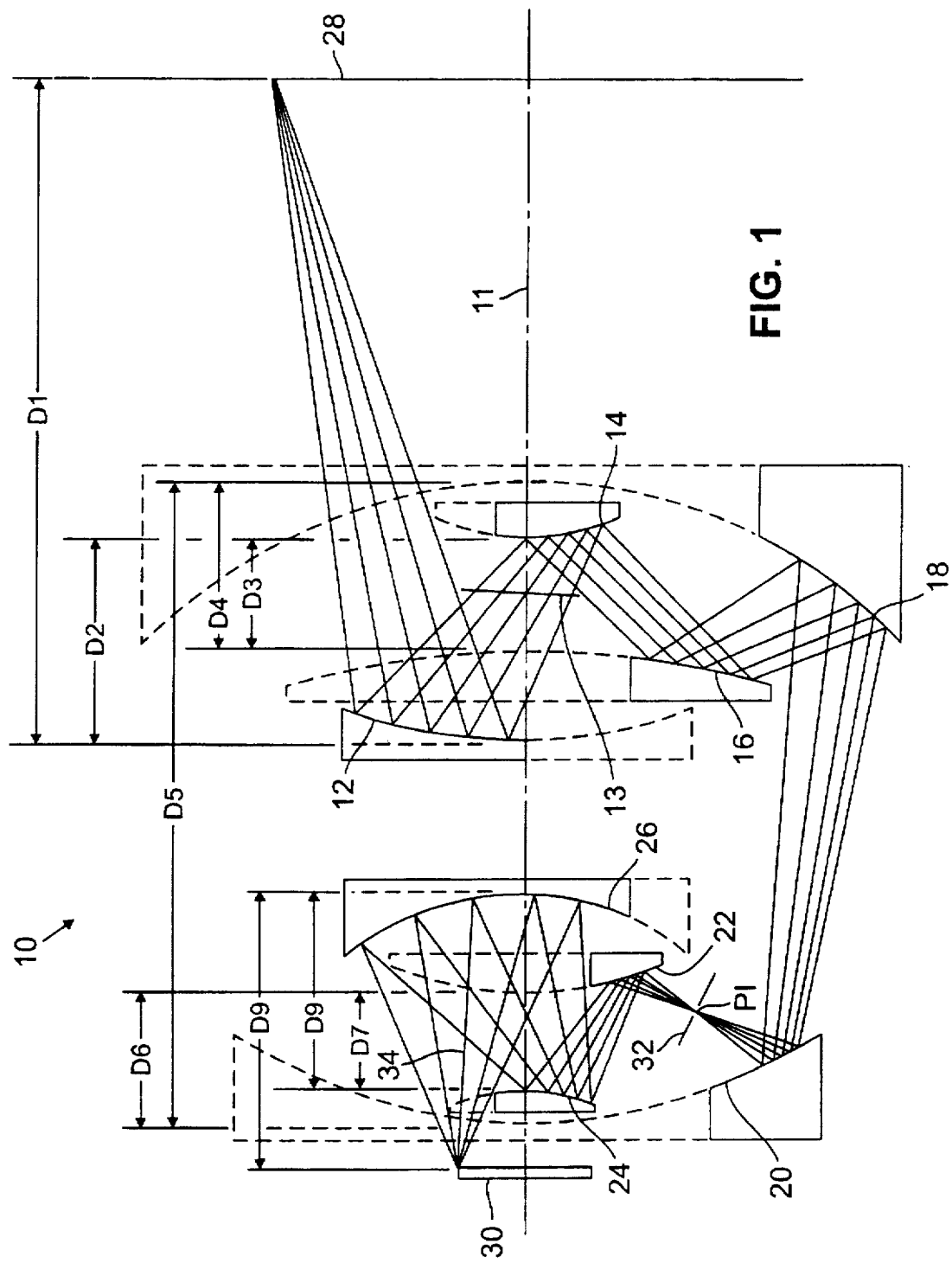
FIG. 1 is a schematic view of a first exemplary embodiment of the present invention projection lithographic system containing eight reflective optical elements.

By way of example, the projection lithographic system shown in FIG. 1 is an eight mirror, all-reflecting, 5:1 reduction imaging system that has a numerical aperture (NA) of 0.5 and an exposure wavelength of 126 nm. From Equation 1, it can be seen that if K=0.7, then the projection lithographic system is capable of imaging 0.18 µm features. In applications where K=0.5, then the projection lithographic system is capable of imaging 0.13 µm features.

Figure 2:
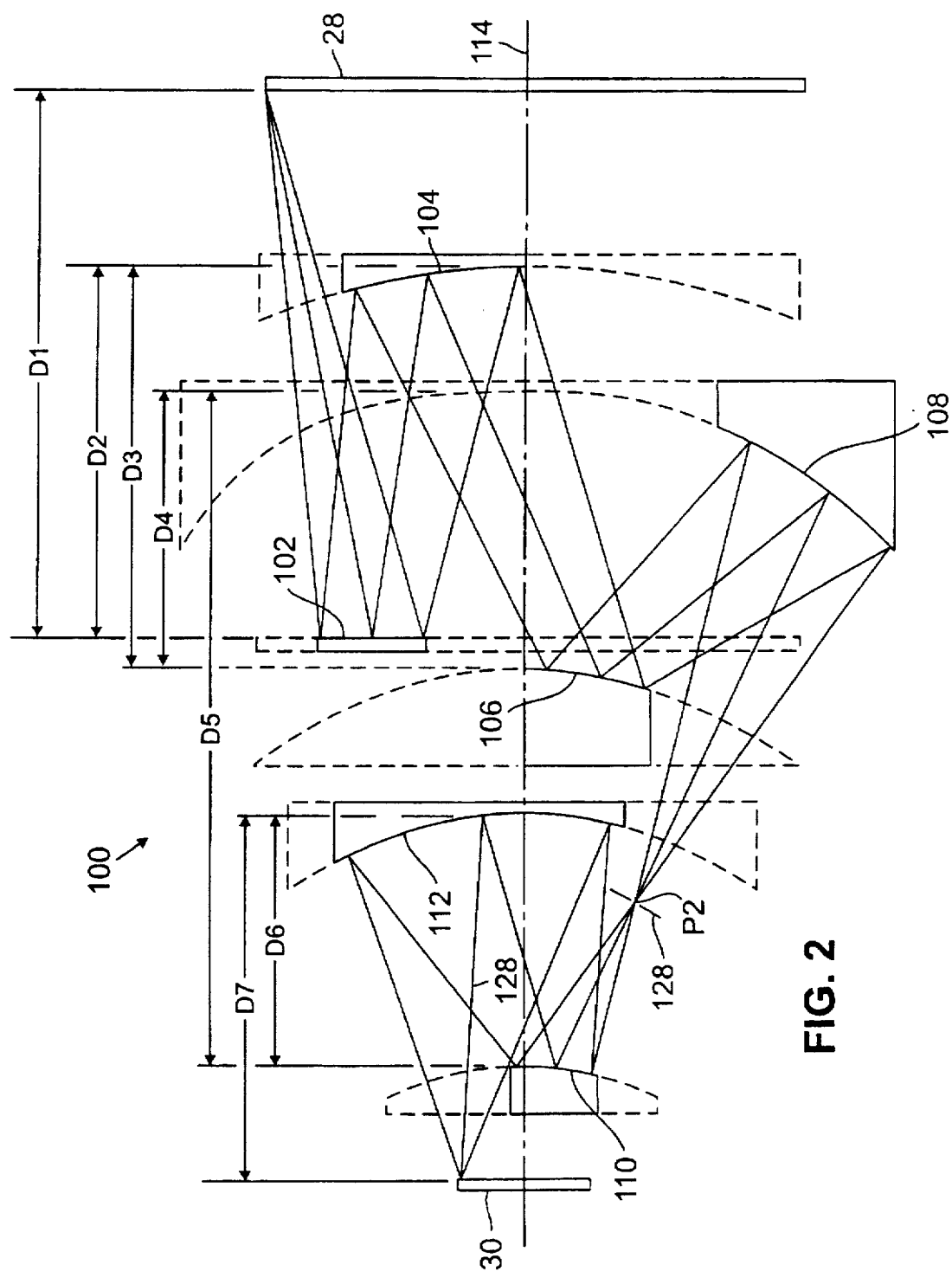
FIG. 2 is a schematic view of a second exemplary embodiment of the present invention projection lithographic system containing six reflective optical elements.

The projection lithographic system shown in FIG. 2 is a six mirror, all-reflecting, 5:1 reduction imaging system that has a numerical aperture (NA) of 0.45 and an exposure wavelength of 126 nm. From Equation 1, it can be seen that if K=0.7, then the projection lithographic system is capable of imaging 0.20 µm features. In applications where K=0.5, then the projection lithographic system is capable of imaging 0.14 µm features.

It will be understood that the described embodiment is merely exemplary and many alternate embodiments can be created within the scope of the present invention by varying the number of mirrors, the reduction ratio, the exposure wavelength, the numerical aperture and the K factor. Although a 126 nm light source is used in both exemplary embodiments, it should be understood that several laser light sources are available between the 100 nm and 300 nm range. For example, in addition to a 126 nm laser light source, at the low end of the selected range commercially available laser light sources are also available for 146 nm, 157 nm, 172 nm and 193 nm.

Referring to FIG. 1, a first exemplary projection lithographic system 10 is shown in accordance with the present invention. The projection lithographic system 10 contains eight reflective surfaces 12, 14, 16, 18, 20, 22, 24, 26 disposed between a lithographic mask 28 and a semiconductor wafer 30. The eight reflective surfaces 12, 14, 16, 18, 20, 22, 24, 26 create a 5:1 reduction in the mask image at the point of the semiconductor wafer 30. The shown projection lithographic system 10 is a scanning system in which the exposure field on the semiconductor wafer 30 is determined by the size of an exposure slit. For the exemplary embodiment, the exposure slit has a 26 mm length and a 1 mm width. In a scanning system, such as that shown, the semiconductor wafer 30 and the lithographic mask 28 are scanned simultaneously. As a result, since the shown embodiment is a 5:1 reduction system, the lithographic mask 28 is moved five times as fast as the semiconductor wafer 30 in order to provide positional synchronization and to ensure an undistorted projected image. Since the lithographic mask 28 and the semiconductor wafer 30 both move, it is important that all of the various optical elements of the projection lithographic system 10 are contained entirely between the lithographic mask 28 and the semiconductor wafer 30 so that they do not interfere with the required movements of the lithographic mask 28 and the semiconductor wafer 30 during scanning.

Within the projection lithographic system 10, the eight reflective surfaces 12, 14, 16, 18, 20, 22, 24, 26 are arranged so that none of the reflective surfaces obstructs the path of light reflected from any of the other reflective surfaces as the light travels from the lithographic mask 28 to the semiconductor wafer 30. Furthermore, each of the eight reflective surfaces 12, 14, 16, 18, 20, 22, 24, 26 are slightly oversized. As a result, the light that impinges upon each of the eight reflective surfaces 12, 14, 16, 18, 20, 22, 24, 26 stays a predetermined distance from the peripheral rim of each reflective surface. The eight reflective surfaces 12, 14, 16, 18, 20, 22, 24, 26, therefore, need not be accurately manufactured right to the peripheral rim of the reflective surface. This greatly increases the practicality of manufacturing the eight reflective surfaces 12, 14, 16, 18, 20, 22, 24, 26.

In the exemplary embodiment, an exposure wavelength of 126 nm is used. Each of the reflective surfaces 12, 14, 16, 18, 20, 24, 26 is coated with material that is highly reflective for the exposure wavelength being used. In the art currently, reflective surfaces for wavelengths of 126 nm are available that accurately reflect such wavelengths with an efficiency near 90%. Such reflective efficiencies are far better than those available for soft X-rays, which reflect at near a 60% efficiency. Since the reflection efficiency of each of the reflective surfaces 12, 14, 16, 18, 20, 22, 24, 26 is near 90%, eight reflective surfaces can easily be used without reducing light intensity below an acceptable level. With at least eight reflective surfaces available, the number of optical designs available is not nearly as limited as that of a soft X-ray projection lithographic system that can use only up to four reflective surfaces due to reflection losses.

For the exemplary embodiment of FIG. 1, the eight reflective surfaces 12, 14, 16, 18, 20, 22, 24, 26 are all aspheric. Furthermore, each of the eight reflective surfaces 12, 14, 16, 18, 20, 24, 26 is disposed along a common optical axis 11, thereby simplifying the assembly of the projection lithographic system 10. Each reflective surface has an aspheric surface that is described by a base conic plus an overlay of a tenth order polynomial. The tenth order polynomial being expressed by Equation 3 below:

$$Z = \frac{KY^2}{1 + SQRT[1 - (1 + CC)K^2Y^2]} +$$

$$(AD)Y^4 + (AE)Y^6 + (AF)Y^8 + (AG)Y^{10}$$

where Z is the sag of the aspheric surface parallel to the Z axis, Y is the radial distance from the Z axis, K is the vertex curvature, CC is the conic constant and AD, AE, AF, and AG are the 4th, 6th, 8th and 10th order deformation coefficients, respectively. The optical criteria of the eight reflective surfaces 12, 14, 16, 18, 20, 22, 24, 26 are expressed in Table I and Table II below.

TABLE I

| REFLECTIVE SURFACE | RADIUS (mm) | DISTANCE (mm) |
|---|---|---|
| Mask | — | — |
|  |  | D1 = 344.154104 |
| 12 | −273.269561 |  |
|  |  | D2 = −106.720916 |
| 14 | −203.023499 |  |
|  |  | D3 = 60.710339 |
| 16 | 430.695901 |  |
|  |  | D4 = −81.278904 |
| 18 | 258.733464 |  |
|  |  | D5 = 329.181973 |
| 20 | −348.127212 |  |
|  |  | D6 = −68.577112 |
| 22 | −188.079216 |  |
|  |  | D7 = 57.986517 |
| 24 | 189.739940 |  |
|  |  | D8 = −110.791207 |
| 26 | 143.316703 |  |
|  |  | D9 = 127.791207 |
| Wafer | — | — |

TABLE II

| REFLECTIVE SURFACE | CONIC AND POLYNOMIAL ASPHERIC DATA | | | | |
|---|---|---|---|---|---|
|  | CC | AD | AE | AF | AG |
| 12 | 8.542838 | −4.0539e−08 | 1.3393e−12 | −3.9894e−17 | 7.0578e−22 |
| 14 | −9.417326 | 2.2325e−07 | −3.9265e−12 | 1.1335e−15 | 1.5180e−18 |
| 16 | 26.601619 | 2.1331e−08 | −3.4140e−13 | 9.7797e−18 | −7.6575e−23 |
| 18 | −0.059052 | −3.9939e−09 | −8.4588e−15 | −3.9825e−19 | −1.5900e−24 |
| 20 | −2.587213 | −5.7782e−08 | 4.8300e−12 | −1.5100e−16 | 2.2061e−21 |
| 22 | −2.731520 | 1.3914e−07 | 1.7815e−13 | 3.4841e−17 | 4.2656e−20 |
| 24 | 6.703040 | 3.6118e−07 | 9.3791e−11 | −1.2688e−14 | 7.3010e−18 |
| 26 | −0.151171 | −2.6008e−09 | −9.6921e−14 | −6.5679e−19 | −3.7601e−22 |

From the data contained within TABLE I and TABLE II, it can be seen that light emanating from the lithographic mask 28 travels distance D1 to the first reflective surface 12. The first reflective surface 12 is concave and directs the light to the second reflective surface 14. An aperture stop 13 is disposed between the first reflective surface 12 and the second reflective surface 14. Although the aperture stop 13 could also be located between the second reflective surface 14 and the third reflective surface 16, the location of the aperture stop 13 is preferably between the first reflective surface 12 and the second reflective surface 14. This location is preferred because at this point the aperture stop 13 is completely accessible, in that no reflective surface or light path interferes with the space occupied by the aperture stop 13.

After the light passes the aperture stop 13, the light impinges upon the second reflective surface 14. The second reflective surface 14 is a convex surface that directs the light to the third reflective surface 16. The third reflective surface 16 is a convex surface that directs the light to the fourth reflective surface 18. The fourth reflective surface 18 is a concave surface that directs the light to the fifth reflective surface 20. The fifth reflective surface 20 is a concave surface that directs the light to the sixth reflective surface 22. At point P1 in between the fifth reflective surface 20 and the sixth reflective surface 22, there is produced a relatively sharp intermediate focus. An optional field stop 32 is disposed proximate point P1 to produce baffling that protects the overall optical design from stray light and scattered rays. The sixth reflective surface 22 is a convex surface that directs the light to the seventh reflective surface 24. The seventh reflective surface 24 is a convex surface that directs the light to the eighth reflective surface 26. Lastly, the eighth reflective surface 26 is a concave surface that directs the light onto the semiconductor wafer 30. The various reflective surfaces are arranged so that the light impinging upon the semiconductor wafer 30 from the eighth reflective surface 26 is telecentric. As a result, the central or chief ray 34 from the fan of rays that reflect from the eighth reflective surface 26 is perpendicular to the plane of the semiconductor wafer 30. This enables a sharp focus to be achieved throughout the field of exposure on the semiconductor wafer 30.

From FIG. 1., it can be seen that the eight reflective surfaces 12, 14, 16, 18, 20, 22, 24, 26 are arranged into four subsystems. Working backward from the semiconductor wafer 30, it can be seen that the eighth reflective surface 26 and the seventh reflective surface 24 produce an off-axis Cassegrain relay subsystem. The large concave shape of the eighth reflective surface 26 acts in conjunction with the relatively small convex shape of the seventh reflective surface 24 to produce a subsystem where the reflective surfaces 24, 26 do not interfere with the path of light yet also change the speed of the light ray cone by a factor of two or more. The Cassegrain relay subsystem of the seventh and eighth reflective surfaces 24, 26 thereby enable the remainder of the projection lithographic system 10 to operate with much slower speed light ray fans, which reduces aberrations and makes it easier to produce a design where the reflective surfaces do not interfere with the path of light. The Cassegrain relay subsystem of the seventh and eighth reflective surfaces 24, 26 also act to position the focus point of the semiconductor wafer 30 at a point beyond the area occupied by the eight reflective surfaces 12, 14, 16, 18, 20, 22, 24, 26. For these reasons, the Cassegrain relay subsystem of a large concave reflective surface and a much smaller convex reflective surface immediately prior to the semiconductor wafer 30 is a feature shared by all embodiments of the present invention, regardless of whether the embodiment has six, seven or eight reflective surfaces.

In the shown embodiment, the Cassegrain relay subsystem of the seventh and eighth reflective surfaces 24, 26 produces an intermediate image at point P1 that is conjugate to the final image on the semiconductor wafer 30. Located close to the intermediate image at point P1 are the fifth and sixth reflective surfaces 20, 22, that act as field mirrors. The intermediate image at point P1 can be located in front of, between, or behind the region of the fifth and sixth reflective surfaces 20, 22, but is preferably located between the fifth and sixth reflective surfaces 20, 22, as is shown. In alternate embodiments of the projection lithographic system, containing either seven or six reflective surfaces, either one or both of the field mirrors are eliminated from the overall design. The optical effect of the field mirrors in such an alternative embodiment is then embodied within the remaining reflective surfaces.

The third and fourth reflective surfaces 16, 18 and the first and second reflective surfaces 12, 14 also create off-axis Cassegrain relay subsystems. In each subsystem there is a large concave reflective surface, i.e. the first reflective surface 12 and the fourth reflective surface 18, and a smaller convex reflective surface, i.e. the second reflective surface 14 and the third reflective surface 16. In each preferred embodiment of the present invention projection lithographic system 10, there are contained at least three off-axis Cassegrain relay subsystems, wherein each subsystem includes a large concave reflective surface and a smaller convex reflective surface. The off-axis Cassegrain relay subsystems can then be combined with a number of field mirrors to produce a projection lithographic system having either six, seven or eight reflective surfaces.

As has been previously stated, each of the eight reflective surfaces 12, 14, 16, 18, 20, 22, 24, 26 used in the exemplary embodiment is aspheric. Each reflective surface has an aspheric surface that is described by a base conic plus an overlay of a tenth order polynomial. In the shown embodiment, the worst aspheric departure of any reflective surface is held below +/-75u. As such, the reflective surfaces have tolerances that are approximately four times tighter than that used for lenses in a traditional projection lithographic system. However, in a traditional projection lithographic system, there are typically at least twenty lens elements. In the present invention projection lithographic system, there are only six to eight reflective surfaces. As such, the overall tolerances of the present invention projection lithographic system are actually less strict than those of traditional projection lithographic systems that contain lenses.

By using an optical system with eight reflective surfaces 12, 14, 16, 18, 20, 22, 24, 26 that have a reflective efficiency of over 90%, at least 43% of the original light intensity is received by the semiconductor wafer 30. This is more than 2.5 times the intensity of a soft X-ray projection lithographic system having only four reflective surfaces with a reflective efficiency of 60%.

Referring to FIG. 2, a second exemplary projection lithographic system 100 is shown in accordance with the present invention. The projection lithographic system 10 contains six reflective surfaces 102, 104, 106, 108, 110, 112, disposed between a lithographic mask 28 and a semiconductor wafer 30. The six reflective surfaces 102, 104, 106, 108, 110, 112, create a 5:1 reduction in the mask image at the point of the semiconductor wafer 30. For the exemplary embodiment, the exposure slit has a 26 mm length and a 1 mm width.

Within the projection lithographic system 100, the six reflective surfaces 102, 104, 106, 108, 110, 112 are arranged so that none of the reflective surfaces obstructs the path of light reflected from any of the other reflective surfaces as the light travels from the lithographic mask 28 to the semiconductor wafer 30. Furthermore, as with the first embodiment, each of the six reflective surfaces 102, 104, 106, 108, 110, 112 are slightly oversized. As a result, the light that impinges upon each of the six reflective surfaces 102, 104, 106, 108, 110, 112 stays a predetermined distance from the peripheral rim of each reflective surface.

In the exemplary embodiment, an exposure wavelength of 126 nm is used. Each of the reflective surfaces 102, 104, 106, 108, 110, 112 is coated with material that is highly reflective for the exposure wavelength being used. Since the shown embodiment uses only six reflective surfaces 110, 112, 114, 116, 118, 120, 122, the reflective surfaces need not be as highly reflective as the surfaces in the original embodiment that contained eight reflective surfaces.

For the exemplary embodiment of FIG. 2, the six reflective surfaces 102, 104, 106, 108, 110, 112 are all aspheric. Furthermore, each of the six reflective surfaces 102, 104, 106, 108, 110, 112, is disposed along a common optical axis 114, thereby simplifying the assembly of the projection lithographic system 100. Each reflective surface has an aspheric surface that is described by a base conic plus an overlay of a tenth order polynomial, as expressed by equation 3. The optical criteria of the eight reflective surfaces 12, 14, 16, 18, 20, 22, 24, 26 are expressed in Table I and Table II below.

TABLE III

| REFLECTIVE SURFACE | RADIUS (mm) | DISTANCE (mm) |
|---|---|---|
| Mask | — | — |
|  |  | D1 = 290.028067 |
| 102 | 6.3140e+03 |  |
|  |  | D2 = -201.933440 |
| 104 | 422.774076 |  |
|  |  | D3 = 200.525350 |
| 106 | 126.167764 |  |
|  |  | D4 = -150.114788 |
| 108 | 256.525897 |  |
|  |  | D5 = 369.923546 |
| 110 | 284.429160 |  |
|  |  | D6 = -143.065597 |
| 112 | 180.531843 |  |
|  |  | D7 = 163.073121 |
| Wafer | — | — |

TABLE IV

| REFLECTIVE SURFACE | CONIC AND POLYNOMIAL ASPHERIC DATA ||||| 
|---|---|---|---|---|---|
|  | CC | AD | AE | AF | AG |
| 102 | — | -8.9629e-10 | -7.1299e-14 | -1.2802e-18 | -2.2608e-23 |
| 104 | 4.873661 | 6.1512e-09 | -9.8208e-14 | -1.0495e-19 | -14.5677e-24 |
| 106 | 2.754596 | 1.0831e-07 | -2.5184e-12 | 5.0119e-16 | -3.2827e-20 |
| 108 | -0.003969 | -3.0633e-10 | -1.7257e-16 | -7.3648e-20 | 4.6269e-25 |
| 110 | 36.865234 | 3.6022e-07 | -2.7711e-11 | 8.7691e-15 | -4.7461e-19 |
| 112 | -0.111369 | -9.4424e-10 | -1.4367e-14 | -1.4326e-19 | -8.5571e-24 |

From the data contained within TABLE III and TABLE IV, it can be seen that light emanating from the lithographic mask 28 travels to the first reflective surface 102. The first reflective surface 102 is convex and directs the light to the second reflective surface 104. An aperture stop 103 is disposed between the first reflective surface 102 and the second reflective surface 104. This location is preferred because at this point the aperture stop 13 is completely accessible, in that no reflective surface or light path interferes with the space occupied by the aperture stop 103.

After the light passes the aperture stop 103, the light impinges upon the second reflective surface 104. The second reflective surface 104 is a concave surface that directs the light to the third reflective surface 106. The third reflective surface 106 is a convex surface that directs the light to the fourth reflective surface 108. The fourth reflective surface 108 is a concave surface that directs the light to the fifth reflective surface 112. The fifth reflective surface 110 is a convex surface that directs the light to the sixth reflective surface 112. Lastly, the sixth reflective surface 112 is a concave surface that directs the light onto the semiconductor wafer 30. At point P2 in between the fourth reflective surface 110 and the fifth reflective surface 112, there is produced a relatively sharp intermediate focus. An optional field stop 126 is disposed proximate point P2 to produce baffling that protects the overall optical design from stray light and scattered rays. The various reflective surfaces are arranged so that the light impinging upon the semiconductor wafer 30 from the eighth reflective surface 26 is telecentric. As a result, the central or chief ray 128 from the fan of rays that reflect from the sixth reflective surface 112 is perpendicular to the plane of the semiconductor wafer 30. This enables a sharp focus to be achieved throughout the field of exposure on the semiconductor wafer 30.

From FIG. 2., it can be seen that the six reflective surfaces 102, 104, 106, 108, 110, 112 are arranged into three subsystems. Working backward from the semiconductor wafer 30, it can be seen that the sixth reflective surface 112 and the fifth reflective surface 110 produce an off-axis Cassegrain relay subsystem. The large concave shape of the sixth reflective surface 112 acts in conjunction with the relatively small convex shape of the fifth reflective surface 110 to produce a subsystem where the reflective surfaces 110, 112 do not interfere with the path of light yet also change the speed of the light ray cone. The Cassegrain relay subsystem of the fifth and sixth reflective surfaces 110, 112 thereby enable the remainder of the projection lithographic system 100 to operate with much slower speed light ray fans, which reduces aberrations and makes it easier to produce a design where the reflective surfaces do not interfere with the path of light. The Cassegrain relay subsystem of the fifth and sixth reflective surfaces 110, 112 also act to position the focus point of the semiconductor wafer 30 at a point beyond the area occupied by the six reflective surfaces 102, 104, 106, 108, 110, 112.

The third and fourth reflective surfaces 106, 108 and the first and second reflective surfaces 102, 104 also create off-axis Cassegrain relay subsystems. In each subsystem there is a convex reflective surface, i.e. the first reflective surface 102 and the third reflective surface 106, and a larger concave reflective surface, i.e. the second reflective surface 104 and the fourth reflective surface 108.

As has been previously stated, each of the eight reflective surfaces 12, 14, 16, 18, 20, 22, 24, 26 used in the exemplary embodiment is aspheric. Each reflective surface has an aspheric surface that is described by a base conic plus an overlay of a tenth order polynomial. In the shown embodiment, the worst aspheric departure of any reflective surface is held below +/−50u.

By using an optical system with six reflective surfaces 102, 104, 106, 108, 110, 112, even if each reflective surface had a reflective efficiency of only 80%, the overall system would be more than twice as efficient as a soft X-ray projection lithographic system having only four reflective surfaces with a reflective efficiency of 60%.

Although the present invention as described above represents exemplary embodiments of a system with eight reflective surfaces and six reflective surfaces, it should be understood that an optical system with reflective surfaces is also possible. The present invention projection lithographic system can be modified by a person skilled in the art using functionally equivalent components and circuits. For example, modifications would be produced in the exemplary embodiment if variations were made in the exposure wavelength, the numerical aperture, the number of reflective surfaces, the size of the semiconductor wafer features, the exposure field and the exposure slot size. All such modifications and alternate embodiments are intended to be included within the scope of the present invention as defined by the appended claims.

What is claimed is:

1. An optical system for use in projection lithography where features from a lithographic mask are projected onto a semiconductor wafer using an exposure wavelength, said optical system comprising:
   at least six reflective surfaces disposed between said lithographic mask and said semiconductor wafer, wherein each of said reflective surfaces is aspheric.

2. The optical system according to claim 1, wherein each of said reflective surfaces reflects said exposure wavelength at an efficiency of at least 90%.

3. The optical system according to claim 1, wherein said exposure wavelength is greater than 100 nm.

4. The optical system according to claim 1, wherein said at least six reflective surfaces include a last reflective surface, prior to said semiconductor wafer, and a second to last reflective surface, wherein said last reflective surface is a concave surface and said second to last reflective surface is a smaller convex surface.

5. The optical system according to claim 4, wherein said reflective surfaces create an image conjugate at a point prior to said exposure wavelength impinging upon said smaller convex surface.

6. The optical system according to claim 4, wherein said concave surface is telecentrically aligned with said semiconductor wafer.

7. The optical system according to claim 4, wherein said concave surface and said smaller convex surface form an off-axis Cassegrain relay.

8. The optical system according to claim 1, wherein said at least six reflective surfaces include a first subsystem, a second subsystem and a third subsystem, wherein each subsystem includes a reflective concave surface and a smaller reflective convex surface.

9. The optical system according to claim 1, wherein each of said at least six reflective surfaces is disposed along a common optical axis.

10. The optical system according to claim 1, wherein said exposure wavelength travels along an optical path from said lithographic mask to said semiconductor wafer and said reflective surfaces are positioned not to interfere with said optical path.

11. The optical system according to claim 1, wherein said exposure wavelength is selected from a group consisting of 126 nm, 146 nm, 157 nm, 172 nm and 193 nm.

12. The optical system according to claim 1, wherein said at least six reflective surfaces are configured to contain eight reflective surfaces.

13. The optical system according to claim 5, further including a field stop disposed proximate said image conjugate.

14. The optical system according to claim 1, wherein said at least six reflective surfaces includes a first reflective surface and a second reflective surface and said optical system further includes an aperture stop disposed between said first reflective surface and said second reflective surface.

15. A method of projecting a reduced image of a lithographic mask on a semiconductor wafer using an exposure wavelength, comprising the steps of:

positioning at least six reflective aspheric surfaces between said lithographic mask and said semiconductor wafer, wherein each of said reflective surfaces is capable of reflecting said exposure wavelength; and reflecting said exposure wavelength from said at least six reflective aspheric surfaces wherein said reflective surfaces produce said reduced image on said semiconductor wafer.

16. The method according to claim 15, wherein each of said at least six reflective aspheric surfaces reflects said exposure wavelength with a efficiency of at least 80%.

17. The method according to claim 15, wherein said at least six reflective surfaces includes a last reflective surface, prior to said semiconductor wafer, and a second to last reflective surface, wherein said at least six reflective surfaces are arranged to create an image conjugate prior to said second to last reflective surface.

18. The method according to claim 17, further including the step of providing an aperture stop at said image conjugate.

19. The method according to claim 15, wherein said exposure wavelength is contained between the deep ultraviolet and the vacuum ultraviolet.

20. The method according to claim 17, wherein said last reflective surface is a concave surface and said second to last reflective surface is a smaller convex surface.

* * * * *

UNITED STATES PATENT AND TRADEMARK OFFICE
CERTIFICATE OF CORRECTION

PATENT NO. : 5,686,728
DATED : November 11, 1997
INVENTOR(S) : David R. Shafer

It is certified that error appears in the above-identified patent and that said Letters Patent is hereby corrected as shown below:

```
  Title page,insert item [73] to read as follows:
-- Lucent Technologies Inc.
   Murray Hills, NJ --.
```

Signed and Sealed this

Twenty-ninth Day of December, 1998

*Attest:*

BRUCE LEHMAN

*Attesting Officer*  Commissioner of Patents and Trademarks